(12) United States Patent
Watanabe et al.

(10) Patent No.: US 8,270,225 B2
(45) Date of Patent: Sep. 18, 2012

(54) DATA RECEIVING CIRCUIT

(75) Inventors: Daisuke Watanabe, Tokyo (JP);
Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 321 days.

(21) Appl. No.: 12/532,134

(22) PCT Filed: Mar. 18, 2008

(86) PCT No.: PCT/JP2008/000633
§ 371 (c)(1),
(2), (4) Date: Jan. 4, 2010

(87) PCT Pub. No.: WO2008/114508
PCT Pub. Date: Sep. 25, 2008

(65) Prior Publication Data
US 2010/0128538 A1    May 27, 2010

(30) Foreign Application Priority Data
Mar. 22, 2007 (JP) ................................. 2007-074731

(51) Int. Cl.
*G11C 7/10* (2006.01)
(52) U.S. Cl. .................... 365/189.05; 365/194; 365/201; 365/193
(58) Field of Classification Search ............. 365/189.05, 365/194, 201, 193
See application file for complete search history.

(56) References Cited

U.S. PATENT DOCUMENTS

| 7,401,272 B1* | 7/2008 | Birk et al. ................. 714/724 |
| 2007/0198881 A1* | 8/2007 | Volkerink et al. ............ 714/724 |
| 2008/0205565 A1* | 8/2008 | Fuhrmann et al. ........... 375/355 |

FOREIGN PATENT DOCUMENTS

| JP | 02-062983 | 3/1990 |
| JP | 10-319089 | 12/1998 |
| JP | 2001-133485 | 5/2001 |
| JP | 2003-057320 | 2/2003 |
| JP | 2006-333489 | 12/2006 |
| JP | 2007-017257 | 1/2007 |
| WO | WO2006-117721 | 11/2006 |
| WO | WO2006117721 | * 11/2006 |

OTHER PUBLICATIONS

Applicant-provided Office Action issued for Corresponding Korean Patent Application No. 10-2009-7021996, dated Feb. 2, 2012, and its English translation, also provided by applicant.

* cited by examiner

*Primary Examiner* — Fernando Hidalgo
(74) *Attorney, Agent, or Firm* — Ladas & Parry, LLP

(57) ABSTRACT

A variable delay circuit provides an adjustable delay to a strobe signal. An input latch circuit latches each bit data included in internal serial data by a strobe signal delayed by the variable delay circuit. A delay set unit adjusts a delay amount provided to the strobe signal by the variable delay circuit. While a calibration operation is being executed in which a known calibration pattern is inputted as serial data, the delay set unit statistically acquires output latch data of the input latch circuit, and adjusts the delay amount such that probabilities of occurrence of 1 and 0 becomes a predetermined ratio.

8 Claims, 7 Drawing Sheets

DATA RECEIVING CIRCUIT

BACKGROUND OF THE INVENTION

1. Field of the Invention

The present invention relates to a data receiving technique in which bit data included in bit stream data inputted as a bit stream is received by using a strobe signal, and more particularly, to a timing adjustment technique for a strobe signal.

2. Description of the Related Art

In order to transmit/receive data between semiconductor integrate circuits through a small number of data transmission lines, serial data transmission is used. Reception of the serial data can be executed by latching each bit data included in the serial data by a strobe signal synchronized with the bit data.

A semiconductor test apparatus (also simply referred to as a test apparatus) that tests a semiconductor circuit outputting serial data as a DUT (Device Under Test) will be considered. In this case, an unexpected delay may occur in the serial data or a clock due to a variation in wire lengths or influence of a parasitic capacitance, which occur in the DUT and the test apparatus. In order to accurately receive the serial data in such circumstances, it is needed that an edge timing of the strobe signal is adjusted so as to satisfy set-up time and hold time conditions of a latch circuit. Patent Documents 1 and 2 disclose related arts.

[Patent Document 1] Japanese Patent Application Publication No. Hei 2-62983

[Patent Document 2] Japanese Patent Application Publication No. 2007-17257

In the case where a plurality of channels of serial data are inputted to a test apparatus, there may occur non-uniform timing deviation (hereinafter, referred to as skew) in the serial data inputted to each channel. In this case, if strobe signals having an identical timing with each other are used for latching each channel of bit data, there is a fear that the set-up time and hold time conditions may be satisfied in a channel, while timing-violation occur in another channel.

When a bit rate for serial data transmission is high, the set-up time and hold time conditions become severe, and hence it is needed that the timing of the strobe signal is independently calibrated with respect to every channel in order to accurately receive all channels of the serial data. Herein, if a calibration period necessary for adjustment of one channel is long, a test period becomes long, resulting in decreased productivity. Also, when receiving a single channel of the serial data, it is preferable that calibration is executed in a shorter time. Such a problem exists in common among various data subjected to bit-stream transmission without being limited to serial data.

SUMMARY OF THE INVENTION

The present invention has been made in view of the foregoing situations, and a purpose thereof is to shorten a period necessary for calibration of a strobe signal.

An embodiment of the present invention relates to a data receiving circuit that receives data by using a strobe signal. The data receiving circuit comprises: a variable delay circuit that provides an adjustable delay to the strobe signal; a latch circuit that latches each bit data included in the bit stream data by using the strobe signal delayed by the variable delay circuit; and a delay control unit for adjusting the delay amount provided to the strobe signal by the variable delay circuit, which statistically acquires, while a calibration operation is being executed in which a known calibration pattern is inputted as the data, output latch data of the latch circuit, and which adjusts the delay amount such that probability of occurrence of one of 1 and 0 approaches a predetermined value.

When latching data having a certain calibration pattern by a strobe signal having a certain timing, frequencies of occurrence (i.e., probabilities of occurrence) of 1 and 0 in the latched data are varied in accordance with a phase difference between the strobe signal and the data. According to the data receiving circuit of the embodiment, a timing of the strobe signal can be optimized by adjusting the delay amount such that probabilities of occurrence of 1 and 0 approach a predetermined value. Further, in the embodiment, because processing of comparing the latched data with an expected value, etc., is not necessary, calibration can be executed in a short time.

The delay control unit may keep the delay amount when the probability of occurrence of either one of 1 and 0 falls within a predetermined range, while shifting the delay amount by a predetermined width one after another, and set the delay in accordance with the delay amount in the variable delay circuit.

The variable delay circuit may adjust the delay mount such that the data is latched by the strobe signal thus delayed, at a timing of transition defined by either one of a positive edge and a negative edge of each bit data included in the bit stream data, and the probability of occurrence of one of 1 and 0 falls within a predetermined range, the center of which is 50%. According to the embodiment, when the edge of the strobe signal approaches approximately the center of the positive edge (or the negative edge) of the data, the probabilities of occurrence of 1 and 0 becomes approximately 50%; while, when the edge thereof is shifted before and behind in terms of time, the probabilities of occurrence thereof depart from 50%. Accordingly, the edge timing of the bit data included in bit stream data can be detected by adjusting the delay amount such that the probabilities of occurrence thereof become 50%, and the timing of the strobe signal can be determined in accordance with the edge timing.

The calibration pattern may repeat 1 and 0 alternately, and the frequency of the strobe signal be set to a value obtained by dividing the bit rate of the data by an even number. In this case, only the positive edge or the negative edge can be selectively extracted and latched by the strobe signal.

The delay control unit may include a counter that counts up or down in accordance with the output latch data of the latch circuit, and acquire the probabilities of occurrence of 1 and 0 in accordance with a count value in the counter.

To the counter, may be inputted a pseudo random pulse stream as an operation clock. The counter may execute a count operation in accordance with the output latch data at the edge timing of the pseudo random pulse stream. In this case, because the relationship between the operation clock of the counter and the frequency of the output latch data is varied in terms of time, occurrence of aliasing or dead band can be suppressed.

The delay control unit may include a capacitor and a charge/discharge circuit that charges or discharges the capacitor in accordance with the output latch data of the latch circuit, and acquire the probabilities of occurrence of 1 and 0 based on a voltage across the capacitor.

When receiving data, the variable delay circuit may add a delay, which is obtained by combining a delay amount obtained by the delay control unit and an offset delay amount set in accordance with a unit interval of the data, to the strobe signal.

Another embodiment of the present invention relates to a test apparatus that tests a plurality of data items outputted from a DUT. The test apparatus comprises a plurality of data receiving circuits according to any one of the aforementioned data receiving circuits, which are provided for each of the plurality of data items. The plurality of data receiving circuits independently adjust the delay amount to be added to the strobe signal.

According to the embodiment, the timing of the strobe signal can be independently calibrated for each channel, and further a calibration can be executed in a short time.

Still another embodiment of the present invention relates to an adjustment circuit that adjusts a timing of a strobe signal supplied to a latch circuit for latching data subjected to bit stream transmission. The adjustment circuit comprises: a variable delay circuit that provides an adjustable delay to the strobe signal; a detection value generation unit that continuously monitors, while a calibration operation is being executed in which a known calibration pattern is inputted as the data, the output latch data of the latch circuit, the output latch data being latched by the strobe signal delayed by the variable delay circuit, and that generates a detection value, the level of which is increased/reduced in accordance with a value of 1 or 0; and a delay control unit that adjusts the delay amount provided to the strobe signal by the variable delay circuit, so that the detection value approaches a predetermined value.

Still another embodiment of the present invention relates to a timing adjustment method for a strobe signal that latches data subjected to bit stream transmission. The method comprises: providing an adjustable delay to the strobe signal; latching each bit data included in the bit stream data by the delayed strobe signal; and adjusting the delay amount provided to the strobe signal, in which, while a calibration operation is being executed in which a known calibration pattern is inputted as the data, the delay amount is adjusted such that probabilities of occurrence of 1 and 0 approach a predetermined value by executing statistic processing of the output latch data thus latched.

It is noted that any combination of the aforementioned components or any manifestation of the present invention exchanged between methods, devices and so forth, is effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
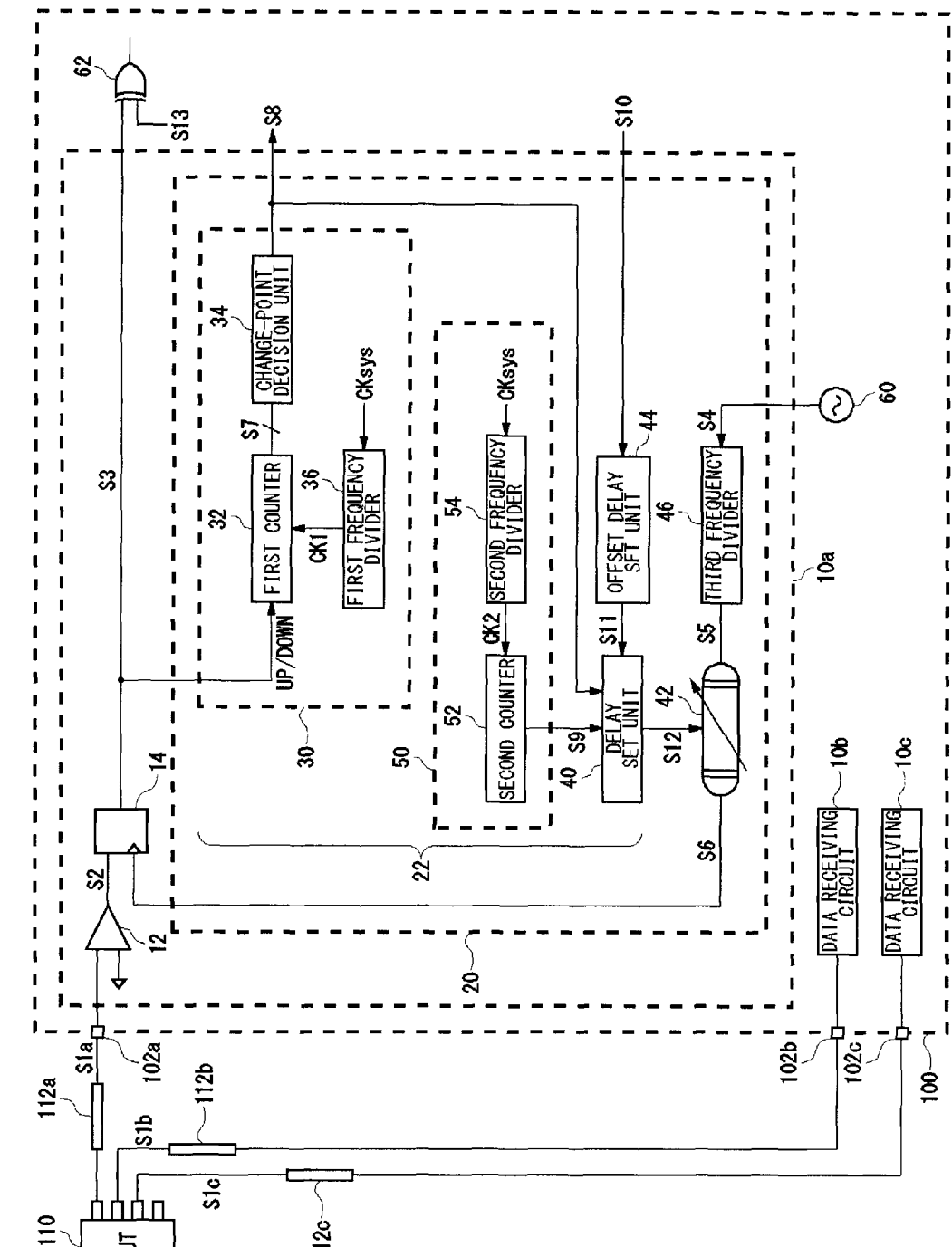
FIG. 1 is a block diagram illustrating a structure of a test apparatus provided with a data receiving circuit according to an embodiment of the present invention.

The present invention will now be described based on preferred embodiments with reference to the accompanying drawings. The same or equivalent constituents, member, or processes illustrated in each drawing will be denoted with the same reference numerals, and the duplicative descriptions thereof are appropriately omitted. The preferred embodiments do not intend to limit the scope of the invention but exemplify the invention. All of the features and the combinations thereof described in the embodiments are not necessarily essential to the invention.

FIG. 1 is a block diagram illustrating a structure of a test apparatus 100 provided with a data receiving circuit 10 according to an embodiment of the present invention. The test apparatus 100 receives a plurality of serial data items S1a to S1c outputted from a DUT 110, which is connected to the test apparatus 100 through transmission paths 112a to 112c, so that the DUT 110 is inspected by comparing the serial data items with respective expected value data S13. It is noted that the number n of the serial data S1 to be inputted is optional, and is not limited to the illustrated case of n=3.

Outline of the whole structure of the test apparatus 100 will be described at first. The serial data items S1a to S1c (simply and collectively referred to as serial data S1) are inputted to input terminals 102a to 102c (simply and collectively referred to as an input terminal 102) of the test apparatus 100. The test apparatus 100 comprises a plurality of data receiving circuits 10a to 10c (simply and collectively referred to as a data receiving circuit 10), which are provided for every input terminal 102, i.e., serial data S1.

The data receiving circuit 10 latches bit data included in the serial data S1 by using a positive edge or a negative edge of a strobe signal S6 having the same frequency as a bit rate of the serial data S1.

The data receiving circuit 10 includes a comparator 12, an input latch circuit 14 and a timing adjustment circuit 20.

The comparator 12 compares a voltage level of the serial data S1 with a predetermined slice level to generate data (hereinafter, referred to as internal serial data S2) taking a high-level (1) or a low-level (0). The input latch circuit 14 is structured by, for example, a flip-flop and a latch circuit. The input latch circuit 14 latches the internal serial data S2 by using the strobe signal S6, the timing of which is adjusted by the timing adjustment circuit 20, which will be described below, and synchronizes the internal serial data S2 with an internal clock of the test apparatus 100.

A decision unit 62 compares output latch data S3 latched by the input latch circuit 14 with the expected value data S13 such that an error rate, etc., is measured or the DUT 110 is determined pass/fail of the DUT 110. In FIG. 1, the decision unit 62 is illustrated as an XOR (eXclusive OR) gate, but can be structured with another circuit element by which bit comparison can be executed.

Outline of the whole structure of the test apparatus 100 has been described above. The test apparatus 100 is used as follows: The DUT 110 is mounted on a socket, etc., and connected to the test apparatus 100. A calibration pattern (training sequence pattern) in a serial format is generated from the DUT 110. The calibration pattern is data to be consistent with the expected value data S13. The data receiving circuit 10 in the test apparatus 100 receives the serial data outputted from the DUT 110 to latch the serial data by the strobe signal S6, and determines pass/fail of the DUT 110 by comparing each bit data with the expected value data.

In the test apparatus 100, in order to accurately latch bit data, it is needed that the timing of the strobe signal S6 meets a demand of a set up time and a hold time specified in the input latch circuit 14. However, the serial data S1 outputted from the DUT 110 has a jitter, or is transmitted while receiving an unexpected delay by the transmission path 112. Accordingly, in order to accurately receive the serial data S1, it is needed that the timing of the strobe signal S6 is optimized in accordance with the serial data S1. Therefore, the data receiving circuit 10 executes a calibration operation for adjusting the timing of the strobe signal S6, prior to reception of the serial data S1.

Hereinafter, a structure of the timing adjustment circuit 20 for executing the calibration in the data receiving circuit 10 will be described in detail.

The timing adjustment circuit 20 comprises a delay control unit 22, a variable delay circuit 42 and a third frequency divider 46.

A reference signal generation unit 60 generates a reference signal S4. The third frequency divider 46 receives the reference signal S4 and frequency divides the signal S4 at an optional frequency dividing ratio to generate a strobe signal S5. The frequency of the strobe signal S5 is set so as to be the same as the bit rate of the serial data S1 in a normal operation. On the other hand, the frequency of the strobe signal S5 in a calibration operation is set to a value obtained by dividing the bit rate of the serial data S1 by m (m: an integer). The frequency of the strobe signal S5 will be described below.

The variable delay circuit 42 provides an adjustable delay to the strobe signal S5. For example, the variable delay circuit 42 may be structured by a buffer chain circuit including a plurality of unit delay elements connected together in cascade, for example, a plurality of inverters, and a switch bypassing each delay element. In this case, the number of inverters through which the strobe signal S5 passes is controlled in accordance with switching on/off of the bypass switch, allowing the delay amount to be adjusted. The unit of a delay adjustment width of the variable delay circuit 42 is denoted by $\Delta t$.

The strobe signal S5 delayed by the variable delay circuit 42 is outputted to a clock terminal of the input latch circuit 14. The input latch circuit 14 latches each bit data included in the internal serial data S2 by using the delayed strobe signal S6.

The delay control unit 22 adjusts the delay amount provided to the strobe signal S5 by the variable delay circuit 42. Summary of a calibration process by the timing adjustment circuit 20 according to the present embodiment will be described.

In executing the calibration of the strobe signal S5, a predetermined calibration pattern is outputted by the DUT 110. The calibration pattern is known on the test apparatus 100 side. During the calibration, the delay control unit 22 statistically acquires the output latch data S3 of the input latch circuit 14. Then, the delay control unit 22 adjusts the delay amount $\tau 1$, which is provided by the variable delay circuit 42, so that the probabilities of occurrence of 1 and 0 in the output latch data S3 have a predetermined ratio.

The variable delay circuit 42 adjusts the delay amount $\tau 1$ such that the serial data is latched at the positive edge timing of each bit data included in the internal serial data S2, and the probabilities of occurrence of 1 and 0 fall within a predetermined target range, for example, the center of which is 50%. More specifically, the target range may be 45% to 55%.

Figure 2:
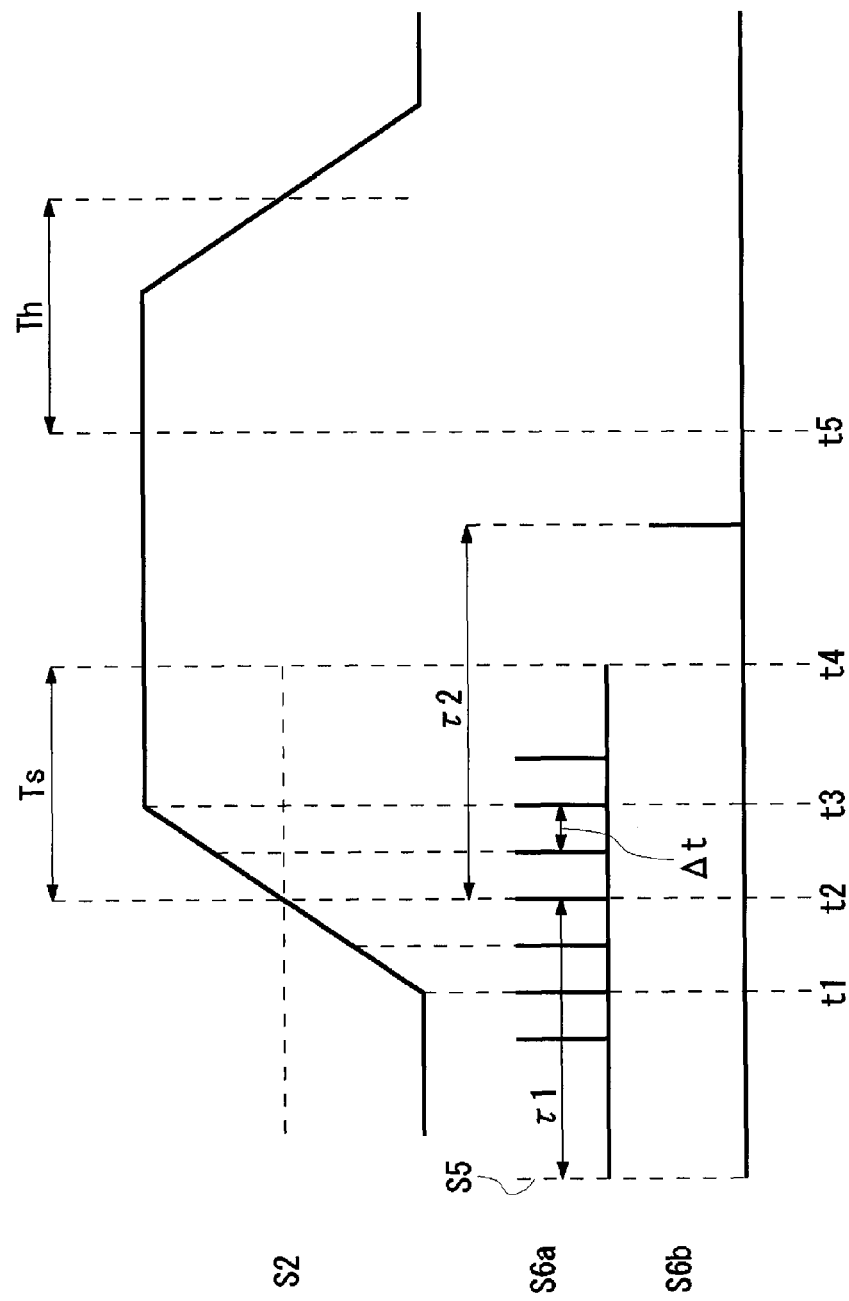
FIG. 2 is a time chart illustrating relationship between internal serial data and a timing of a strobe signal.

FIG. 2 is a time chart illustrating the relationship between the internal serial data S2 and the timing of the strobe signal S5. FIG. 2 illustrates, in turn from top to bottom, the internal serial data S2, a strobe signal S6a during the calibration and a strobe signal S6b after the calibration.

A timing of the strobe signal S6a relative to that of the strobe signal S5 is varied in accordance with the delay amount $\tau 1$. For example, when latching the internal serial data S2 by the strobe signal S6a having a timing t1, probability of being determined as 0 (low-level) becomes high, and hence when statistically acquiring the probabilities of occurrence of 1 and 0, the probability of occurrence of 0 becomes higher than the other. In contrast, when latching that by the strobe signal S6a having a timing t3, probability of being determined as 1 (high-level) becomes high, and hence the probability of occurrence of 1 becomes higher. When latching that by the strobe signal S6a having a timing t2, the probability of being determined as 1 and that of being determined as 0 respectively become 50%, and hence the probabilities of occurrence of 1 and 0 respectively approach 50%.

The timing adjustment circuit 20 according to the present embodiment adjusts the delay amount $\tau 1$ provided to the strobe signal S5 such that the probabilities of occurrence of 1 and 0 respectively approach 50%. The timing of the strobe signal S6a after being adjusted becomes roughly the center of the positive edge of the internal serial data S2.

When latching the internal serial data S2 during a normal test after the calibration has been completed, the timing of the strobe signal S6b is needed to be set to a value between times t4 and t5 in order to meet a demands for the set-up time Ts and the hold time Th. Accordingly, the timing of the strobe signal S6b can be set by adding an offset delay amount $\tau 2$ to the edge timing t2 of the internal serial data S2, the edge timing $\tau 2$ being determined by the aforementioned calibration process.

Figure 3A:
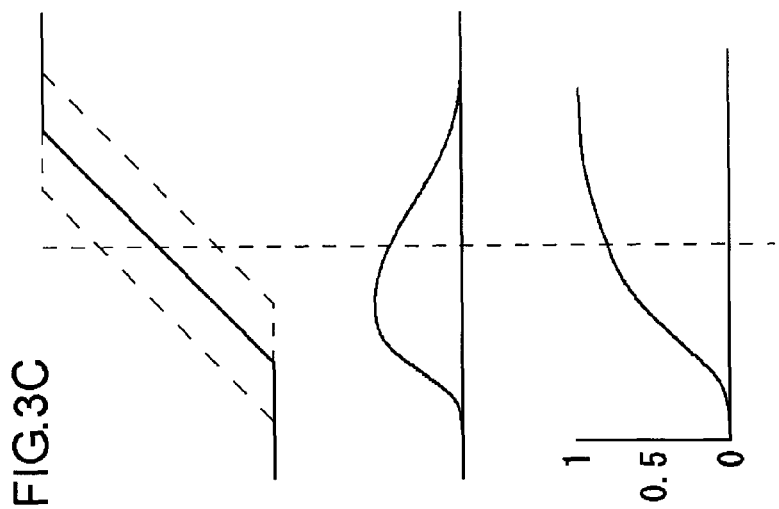
FIGS. 3A to 3C are graphs illustrating a jitter that the internal serial data has and probabilities of occurrence of 1 and 0 (ratio of 1)
Figure 3B:
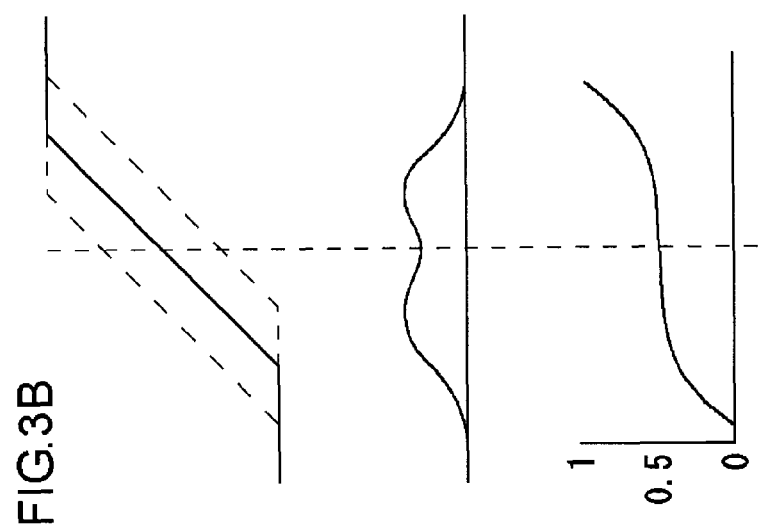
Figure 3C:
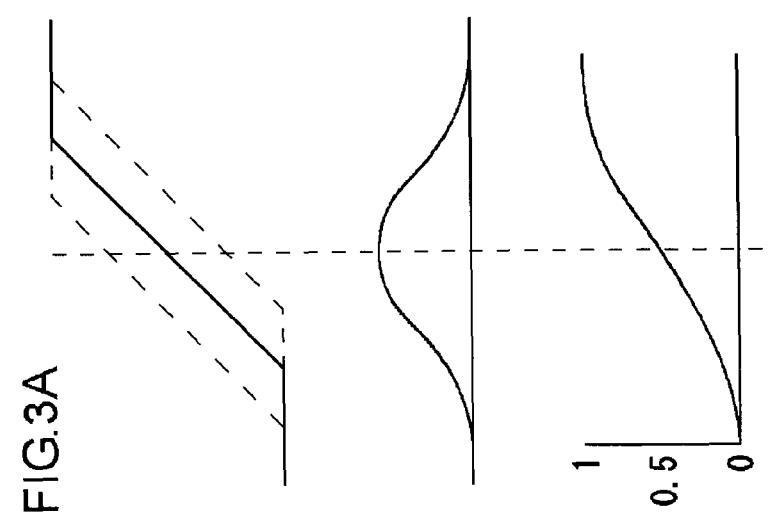

FIGS. 3A to 3C are graphs illustrating a jitter that the internal serial data S2 has and the probabilities of occurrence of 1 and 0 (ratio of 1). Each of FIGS. 3A to 3C illustrates a jitter histogram different from others. The timing at which the probability of occurrence of 1 becomes 50% is located at a position where an integral of the histogram is equally divided into two. In the case of a Gaussian distribution as illustrated in FIG. 3A or a sinusoidal jitter as illustrated in FIG. 3B, the timing at the center of peak-to-peak provides 50% to the probability of occurrence of 1 (or 0). In the case where the center of the jitter histogram deviates from the center of the peak-to-peak as illustrated in FIG. 3C, the timing at which the probability of occurrence of 1 is provided with 50% is shifted. More preferred adjustment can be executed by setting a target value for the probabilities of occurrence of 1 and 0, which is used during the calibration, in accordance with the nature of the jitter that the internal serial data S2 has.

According to the aforementioned calibration process, it is sufficient that the probability of occurrence of data, which is obtained from a result of latching the calibration pattern, is statistically processed. Accordingly, it is not necessary that the calibration pattern and the expected value are compared with each other, allowing the calibration process to be simplified and executed at a high speed. It is noted that the similar process may be executed at the negative edge instead of the positive edge.

Those skilled in the art can appreciate, from the aforementioned descriptions, that various modifications can be made to a circuit structure for realizing the thought of the present invention and such modifications fall within the scope of the invention. Hereinafter, referring back to FIG. 1, specific examples of the structure will be described.

Hereinafter, the case where the calibration pattern alternately repeats 1 and 0 will be described. In this case, the positive edge and the negative edge alternately occur. Accordingly, when statistically processing every other output latch data S3 among all of them during the calibration, the probabilities of occurrence of 1 and 0 respectively become 50%, irrespective of the delay amount $\tau 1$. Therefore, the calibration is to be executed only for the positive edge or for the negative edge.

To do this, the frequency of the strobe signal S5 during the calibration operation is set to a value obtained by dividing the bit rate of the serial data S1 by m (where m is an even number, for example, 2). As a result, it becomes possible that the edge of the strobe signal S6 occurs only at the positive edge timing or the negative edge timing of the internal serial data S2.

The delay control unit 22 includes a timing decision unit 30, a delay set unit 40, an offset delay set unit 44 and a timer circuit 50. The timing decision unit 30 statistically acquires the output latch data S3 to determine the probabilities of occurrence of 1 and 0, and detects the positive edge timing, i.e., a change-point of the internal serial data S2. To realize the function, the timing decision unit 30 in FIG. 1 includes a first counter 32, a change-point decision unit 34 and a first frequency divider 36.

The first frequency divider 36 generates a clock CK1 by frequency dividing a system clock CKsys at a predetermined frequency dividing ratio. The first counter 32 is an up-down counter that counts up or down in accordance with a value of the output latch data S3. The clock CK1 is inputted to the first counter 32 as an operation clock. The first counter 32 counts up if the output latch data S3 is 1, while counts down if that is 0, at every positive edge of the clock CK1. It is noted that the operation clock (CK1) of the first counter 32 may be set irrespective of the frequency of the output latch data S3, which originates from the reference signal S4.

A count value in the first counter 32 becomes data indicating the probabilities of occurrence of 1 and 0, if the calibration pattern is inputted as the serial data S1 and a count operation by the first counter 32 is being executed for a somewhat long period (hereinafter, referred to as a data acquisition period). For example, the count value in the first counter 32 is set to a half-value prior to execution of statistic processing. For example, if the first counter is a 10-bit counter, [1000000000] is set to 512. Thereafter, when starting the count operation, the count value makes a transition in accordance with the probabilities of occurrence of 1 and 0. When the probabilities of occurrence of 1 and 0 are 50%, a value close to 512 is kept; on the other hand, when the probability of occurrence of 1 is higher than the other, the count value is increased, while, when that of 0 is higher, the count value is reduced.

The change-point decision unit 34 determines whether the probabilities of occurrence of 1 and 0 fall within a predetermined range, the center of which is 50%, in accordance with a count value S7 in the first counter 32. To do this, the change-point decision unit 34 may compare the count value S7 with a threshold value. Or, the change-point decision unit 34 may monitor occurrence of a carry or a borrow in the first counter 32. For example, if the frequency of occurrence of 1 is higher, a carry occurs, while if that of 0 is higher, a borrow occurs. If the carry or borrow does not occur for a sufficiently long period, as a result of executing the count processing, it can be determined that the probabilities of occurrence of 1 and 0 are approximately 50%. In this case, the change-point decision unit 34 can be structured by an OR gate that generates a logical addition of all bits of the count value S7 in the first counter 32.

The change-point decision unit 34 generates, as a result of execution of the statistic processing, a flag S8 indicating whether the probabilities of occurrence of 1 and 0 fall within a predetermined target range. For example, if the probabilities of occurrence of 1 and 0 fall within the predetermined target range, the flag S8 is set to 1 and the calibration is completed. While the flag S8 is being 0, the delay control unit 22 keeps varying the delay amount $\tau 1$ provided to the strobe signal S5, at every lapse of a predetermined data acquisition period.

From another point of view, the first counter 32 is understood as a detection value generation unit that continuously monitors the output latch data S3 of the input latch circuit 14 to generate a detection value, the level of which is increased/reduced in accordance with a value of 1 or 0, i.e., the count value S7. The change-point decision unit 34 and the delay set unit 40 are understood as a delay control unit that adjusts the delay amount $\tau 2$ provided to the strobe signal S5 by the variable delay circuit 42, so that the count value S7, a detection value, approaches a predetermined value.

The timer circuit 50 sets the data acquisition period for 1 and 0. The timer circuit 50 includes a second counter 52 and a second frequency divider 54. The second frequency divider 54 generates a clock CK2 by frequency dividing the system clock CKsys. The second counter 52 can be structured by a down counter that counts the clock CK2. When a borrow occurs in a count value in the second counter 52 after counting down from, for example, a maximum, a lapse of the data acquisition period is determined. The lapse of the data acquisition period is communicated to the delay set unit 40 by data S9.

When the flag S8 is 0, the delay set unit 40 keeps varying the delay amount $\tau 1$ by a unit delay $\Delta t$ every time when the lapse of the data acquisition period is communicated. As a result, the flag S8 becomes 1 when a certain delay amount $\tau 1$ is provided, allowing a change-point in the internal serial data S2 to be detected.

As stated above, the timing of the strobe signal S6 to be set in a normal test can be obtained by adding the offset delay amount $\tau 2$ to the delay amount $\tau 1$. The offset delay set unit 44 sets the offset delay amount $\tau 2$ based on data S10, which is set in accordance with a unit interval (cycle) of the bit data of the serial data, and then issues a command to the delay set unit 40. The delay set unit 40 combines the offset delay amount $\tau 2$ and the delay amount $\tau 1$ obtained from the result of the calibration, and delays the strobe signal S5.

Figure 4:
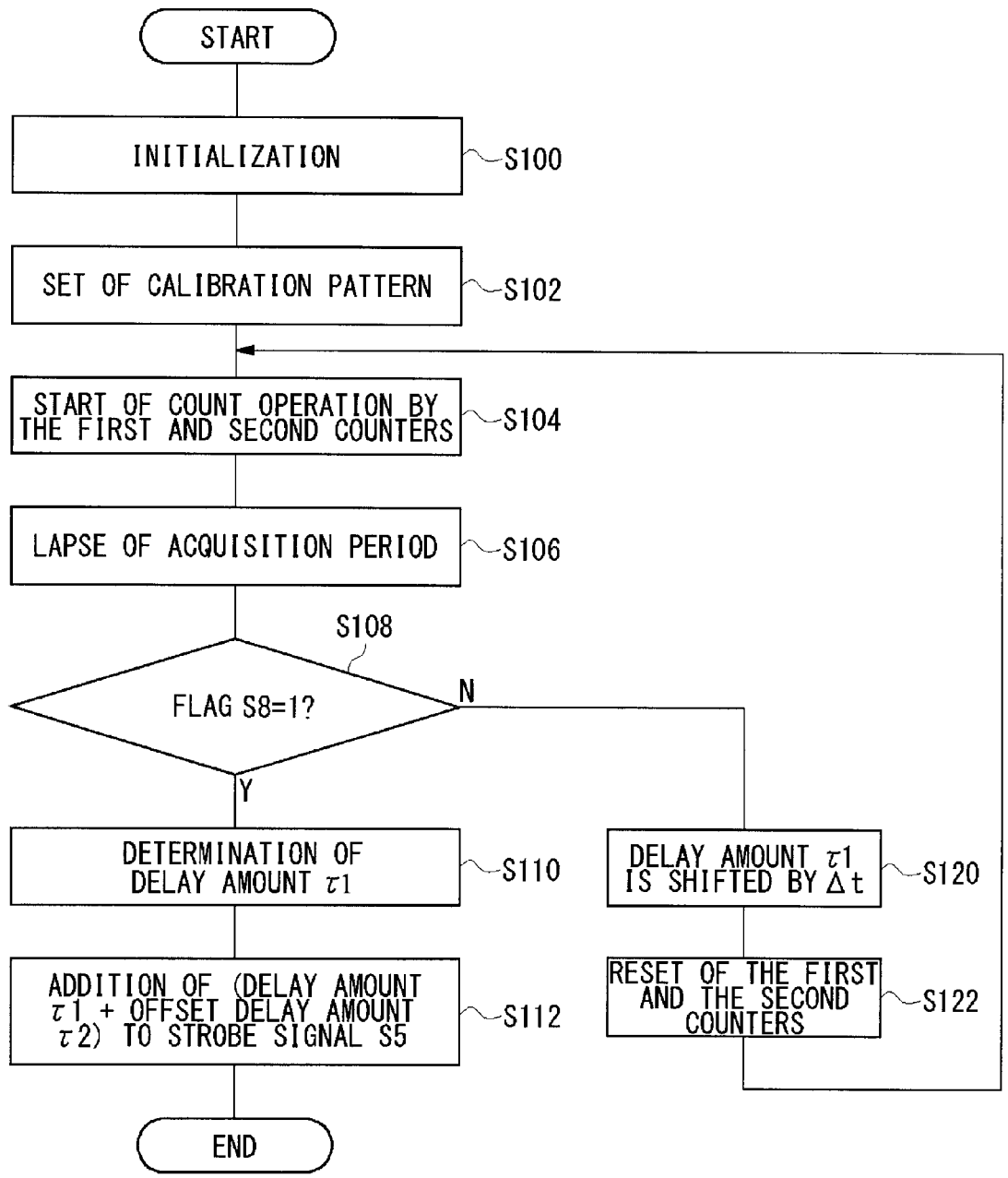
FIG. 4 is a flow chart illustrating operation of the data receiving circuit in FIG. 1.

Operation of the data receiving circuit 10 structured as stated above will be described. FIG. 4 is a flow chart illustrating operation of the data receiving circuit 10 in FIG. 1. The calibration is started after the DUT 110 is connected to the test apparatus 100. At first, the test apparatus 100 is initialized for the calibration (S100). At the time, the delay amount $\tau 1$ is set to an initial value, and the first counter 32 is initialized to a half-value and the second counter 52 to a maximum. Subsequently, the calibration pattern is set as the serial data S1 from the DUT 110 (S102).

Thereafter, count operations are started by the first counter 32 and the second counter 52 (S104). When the lapse of the data acquisition period is determined by the second counter 52 (S106), decision processing for the change-point is executed by the change-point decision unit 34. As a result, if the flag S8 is 1 (S108/Y), the delay amount $\tau 1$ set in the variable delay circuit 42 at the moment is kept (S110). In order to execute a normal test operation, a delay combined with the delay amount $\tau 1$ and the predetermined offset delay amount $\tau 2$, is added to the strobe signal S5, and then the calibration is completed.

If the flag S8 is 0 in the step S108 (S108/N), the delay set unit 40 shifts the delay amount $\tau 1$ by the unit delay $\Delta t$ (S120). Further, the delay set unit 40 resets the first counter 32 to the half-value and the second counter 52 to the maximum (S122), returning to the step 104. The data receiving circuit 10 repeats the processing of the steps S104, S106, S108, S120 and S122 before the flag S8 becomes 1.

Operation of the data receiving circuit 10 has been described above. As stated before, according to the data receiving circuit 10 of the present embodiment, the timing of the strobe signal S6 can be optimized by adjusting the delay amount $\tau 1$ based on the probabilities of occurrence of 1 and 0, which are statistically acquired. In this case, it is not needed to execute processing of comparing the output latch data S3 of the input latch circuit 14 with the expected value, and hence processing complicated in terms of software or hardware is not necessary, allowing the calibration to be executed in a short time.

Further according to the structure in FIG. 1, management of the data acquisition period or statistic processing of the output latch data S3 can be executed by using the counter, and hence there is also an advantage that a calibration mechanism can be structured only by hardware. Still further, the test apparatus 100 in FIG. 1 comprises the data receiving circuit 10 for each channel of the serial data S1, and hence a skew between each channel can be automatically optimized.

The aforementioned embodiments are intended to be illustrative only. It will be appreciated by those skilled in the art that various modifications to the constituting elements and processes could be developed and that such modifications are within the scope of the present invention. Hereinafter, such modifications will be described.

Figure 5:
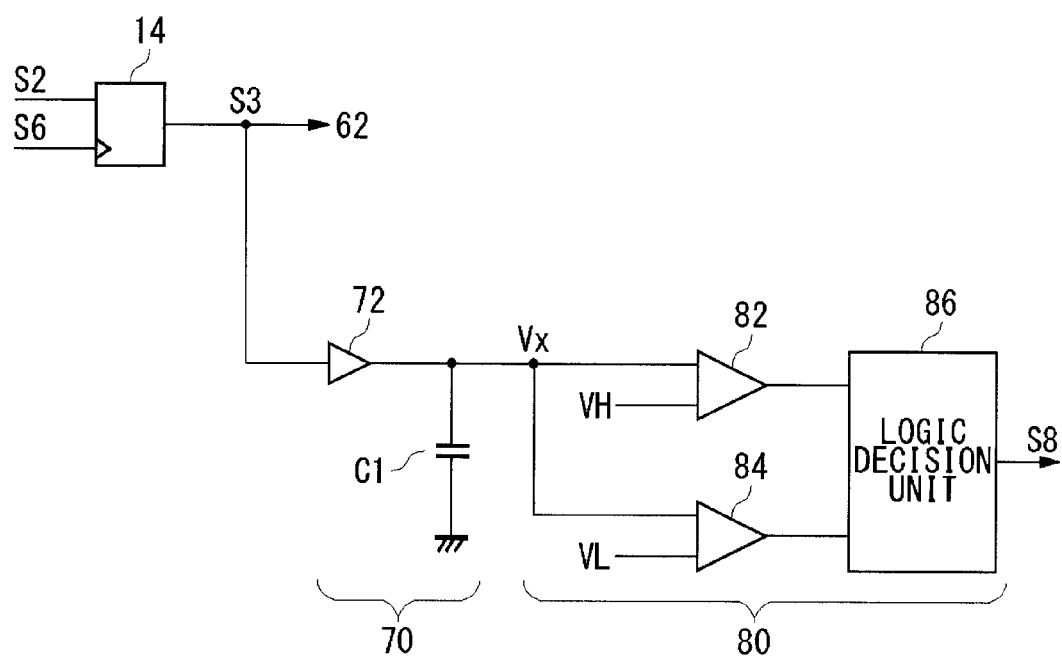
FIG. 5 is a block diagram illustrating part of a structure of a data receiving circuit according to a modification.

FIG. 5 is a block diagram illustrating part of a structure of a data receiving circuit 10f according to a modification. In FIG. 5, the same or equivalent constituting elements as in FIG. 1 are omitted. The data receiving circuit 10 in FIG. 10 determines the probabilities of occurrence of 1 and 0 of the output latch data S3 of the input latch circuit 14 through digital processing. In contrast, the data receiving circuit 10f in FIG. 5 determines that through analog processing. A voltage conversion unit 70 converts the probabilities of occurrence of 1 and 0 into an analog voltage Vx. For example, the voltage conversion unit 70 can be structured by an analog filter and a charge pump circuit. The voltage conversion unit 70 in FIG. 5 includes a buffer 72 and a capacitor C1. An output of the buffer 72 takes either one of a high-level or a low-level in accordance with the output latch data S3, and charges or discharges electric charge of the capacitor C1. The output of the buffer 72 is smoothed by the capacitor C1, generating the analog voltage Vx in accordance with the probabilities of occurrence of 1 and 0 of the output latch data S3.

A change-point decision unit 80 compares the analog voltage Vx with threshold voltages VH and VL, that is, determines whether the probabilities of occurrence of 1 and 0 fall within a target range. The change-point decision unit 80 includes a comparator 82, a comparator 84 and a logic decision unit 86. The comparator 82 compares the analog voltage Vx with an upper threshold voltage VH, while the comparator 84 compares that with a lower threshold voltage VL. The logic decision unit 86 monitors output signals of the comparators 82 and 84, and sets the flag S8 to 1 when detecting a state of VL<Vx<VH. Also according to the modification in FIG. 5, it can be determined whether the probabilities of occurrence of 1 and 0 of the output latch data S3 fall within the target range.

In the embodiment, the case where the strobe signal S5 is frequency divided while the calibration is being executed, in order to detect only the positive edge of the internal serial data S2, has been described. Besides, the following processing may be executed. The frequency of the strobe signal S5 is set and fixed to a value equal to the bit rate of the serial data S1. When the calibration pattern repeats 1 and 0, the output latch data of the input latch circuit 14 becomes data obtained by latching every other positive edge. Therefore, the timing decision unit 30 may acquire every other output latch data of the input latch circuit 14 to reflect it on the statistic processing.

The processing can be realized by setting the frequency of the operation clock CK1 of the first counter 32, to a value obtained by dividing the bit rate of the serial data S1 by an even number. If the frequency of the system clock CKsys is equal to the bit rate of the serial data S1, or equal to a value obtained by multiplying or dividing that by an integer, the aforementioned processing can be readily realized by appropriately setting the frequency dividing ratio of the first frequency divider 36.

Figure 6:
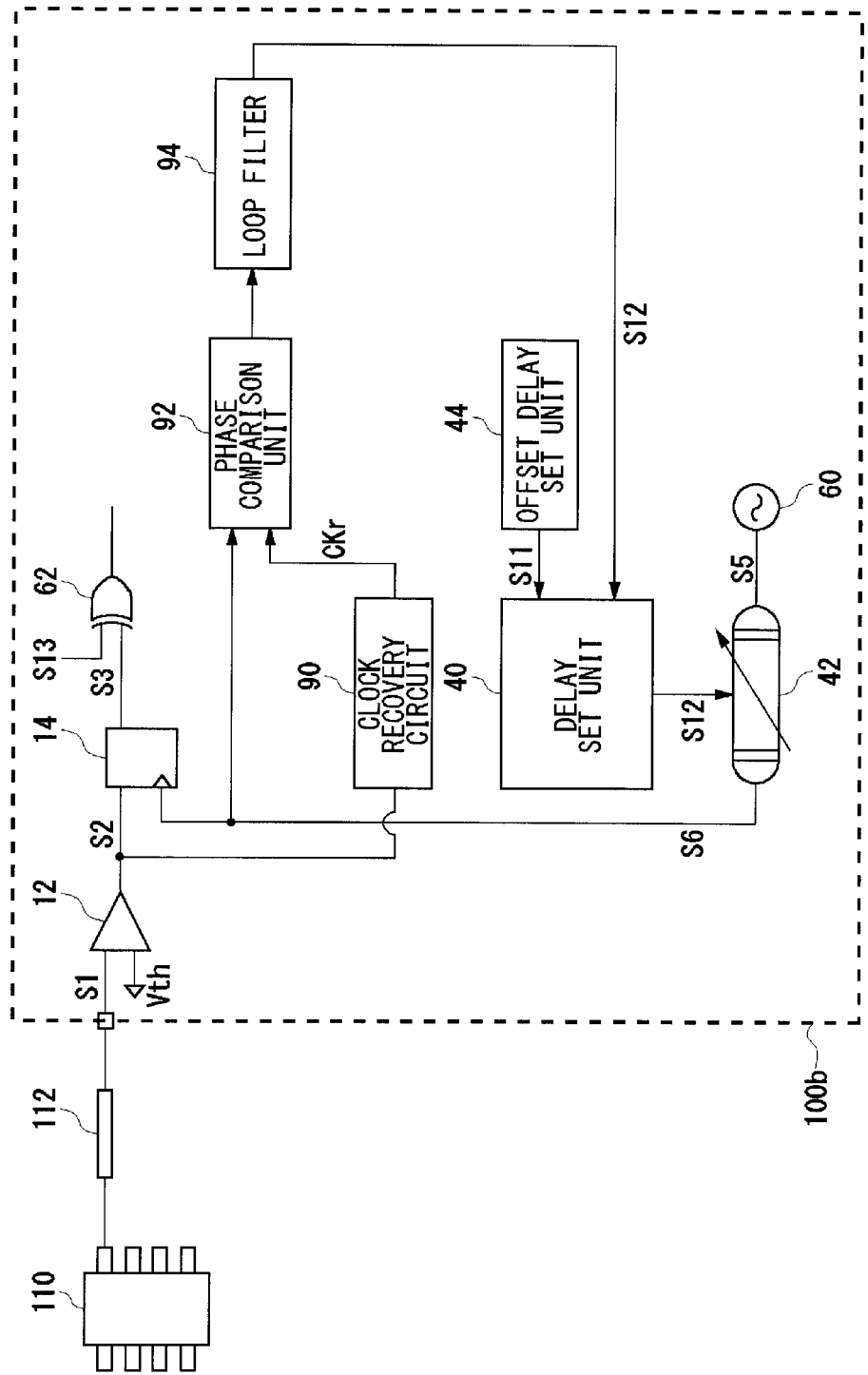
FIG. 6 is a block diagram illustrating a structure of a test apparatus provided with a CDR circuit.

Further another circuit will be described. FIG. 6 is a block diagram illustrating a structure of a test apparatus 100b provided with a CDR circuit (Clock Data Recovery circuit). The DUT 110 to be tested with the test apparatus 100b in FIG. 6 is assumed not to generate the serial data S1 corresponding to a CDR during a normal operation. That is, a clock is not embedded in the serial data S1 during a normal operation. Such DUT 110 is to be tested with the test apparatus 100b in FIG. 6.

The serial data S1 of the DUT 110 is set to a predetermined calibration pattern in a test operation. A clock is embedded in the calibration pattern by the 8B10B encoding.

The test apparatus 100b comprises a clock recovery circuit 90, a phase comparison unit 92, a loop filter 94, a delay set unit 40, a variable delay circuit 42 and an offset delay set unit 44, and structures a so-called DLL (Delay Locked Loop) circuit.

The clock recovery circuit 90 extracts a clock embedded in the internal serial data S2 to generate a regenerated clock CKr. Because the clock recovery circuit 90 is realized by using a known technique, detailed description thereof will be omitted. A reference signal generation unit 60 generates the strobe signal S5 having a predetermined frequency. The frequency of the strobe signal S5 is set so as to be equal to the bit rate of the serial data S1.

The phase comparison unit 92 generates phase difference data corresponding to a phase difference between the regenerated clock CKr and the strobe signal S6. The loop filter 94 filters the phase difference data and outputs it to the delay set unit 40. To the delay set unit 40, are inputted a delay control signal S12 generated by the loop filter 94 and an offset delay set signal S11 outputted from the offset delay set unit 44. The variable delay circuit 42 provides a delay corresponding to the two signals to the strobe signal S5. An offset delay amount is set to 0 during the calibration operation.

Operation of the test apparatus 100b in FIG. 6 will now be described. When starting a test of the DUT 110, the calibration pattern, the clock of which is embedded in the DUT 110, is generated. The test apparatus 100b adjusts the delay amount τ1 of the strobe signal S5 such that the phase thereof is synchronized with that of the regenerated clock CKr extracted from the calibration pattern. When the DLL is locked, the test apparatus 100b ends a tracking operation and combines the delay amount τ1 at the time and the offset delay amount τ2.

When the test apparatus 100b receives multiple channels of serial data for testing a DUT, a skew in the DUT can be resolved in a short time by providing a plurality of DLL circuits for each serial data. The test apparatus 100b may be structured by using a PLL circuit instead of the DLL circuit.

Further, another modification will be described. In the data receiving circuit 10 in FIG. 1, the first counter 32 executes a count operation based on the clock CK1 generated by the first frequency divider 36. In this case, the relationship between the frequency of the clock CK1 and the bit rate of the output latch data S3 is constant. In general, if data to be sampled (S3) is equal to the frequency of a sampling signal (RE), or equal to a value obtained by multiplying or dividing that by an integer, aliasing or dead band may sometimes occur.

Figure 7:
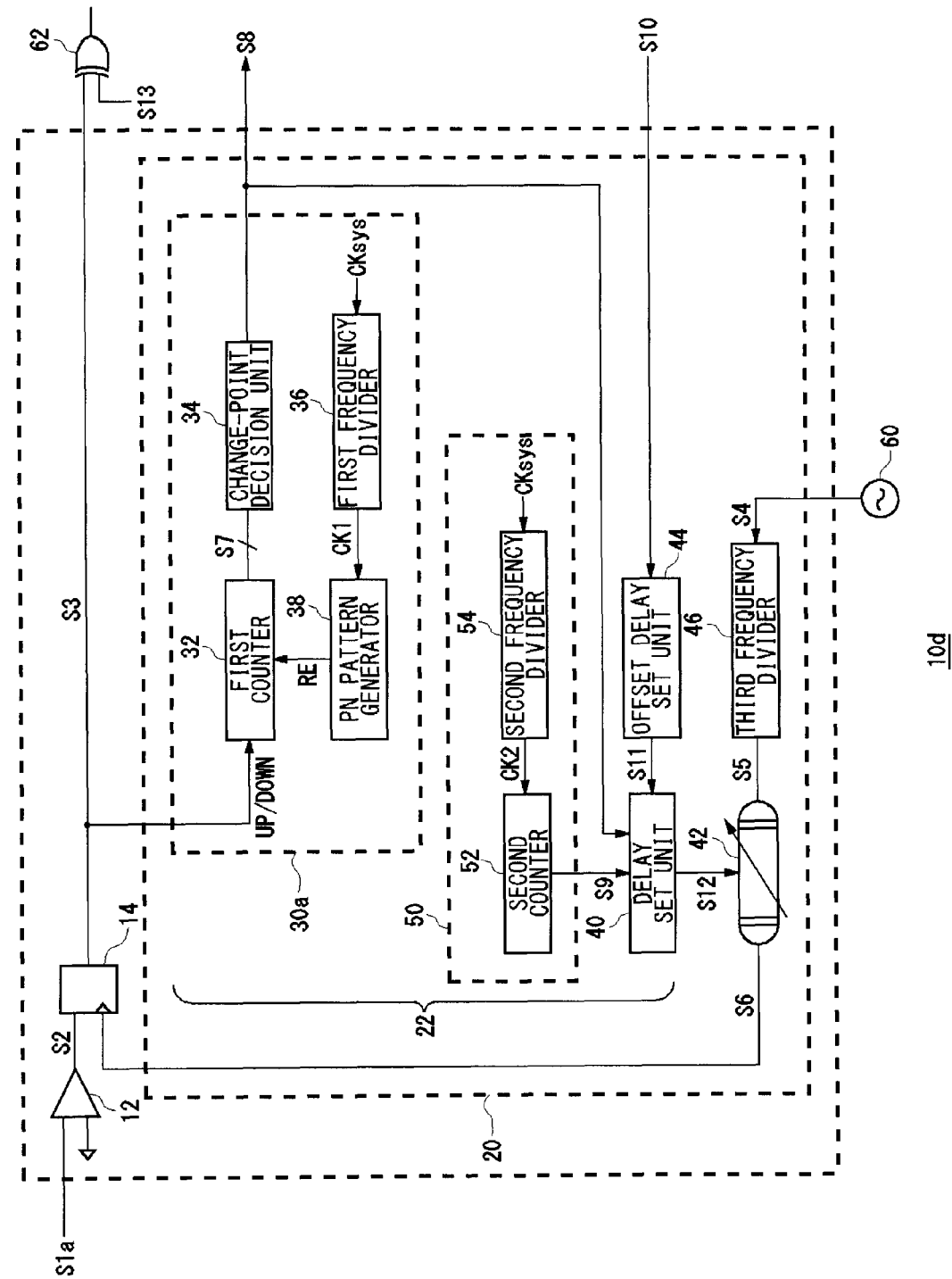
FIG. 7 is a block diagram illustrating a modification of the data receiving circuit in FIG. 1.

To avoid this problem, the following modified processing may be executed. FIG. 7 is a block diagram illustrating a modification of the data receiving circuit 10 in FIG. 1. In the data receiving circuit 10d in FIG. 7, a timing decision unit 30a comprises a PN (Pseudo Random Noise) pattern generator 38 in the subsequent stage of the first frequency divider 36. The PN pattern generator 38 receives the clock CK1 generated by the first frequency divider 36, and generates a pseudo random pulse stream (hereinafter, the positive edge of the pulse stream is referred to as a random edge RE) by using the clock CK1. The frequency in which the random edge RE occurs is not constant, being varied momentarily in accordance with the pattern of the PN pulse stream.

According to the modification in FIG. 7, the first counter 32 is to determine 1 and 0 of the output latch data S3 based on an edge occurring at a random timing, i.e., an edge, the frequency of which is not constant; therefore, the aforementioned relationship between the output latch data S3 and the frequency of the random edge RE, is difficult to be held. As a result, occurrence of aliasing or dead band can be suppressed.

In the embodiment, the case where serial data is inputted to the data receiving circuit 10 has been described; however, the present invention is not limited thereto, but can be applied to various bit stream data.

The present invention has been described based on the preferred embodiments; however, it is clear that the embodiments illustrate only the principle and applications of the invention. Accordingly, it is needless to say that various modifications or changes in the arrangement can be made to the embodiments without departing from the spirit of the invention set forth in the appended claims.

The invention claimed is:

1. A data receiving circuit that receives bit stream data subjected to bit stream transmission by using a strobe signal, the data receiving circuit comprising:
    a variable delay circuit that provides a delay to the strobe signal;
    a latch circuit that latches each bit data included in the bit stream data by using the strobe signal delayed by the variable delay circuit; and
    a delay control unit for adjusting the delay amount provided to the strobe signal by the variable delay circuit, which statistically acquires, while a calibration operation is being executed in which a known calibration pattern is inputted as the data, output latch data of the latch circuit, and which adjusts the delay amount such that probability of occurrence of one of 1 and 0 in the output latch data approaches a predetermined value, wherein the variable delay circuit adjusts the delay amount such that the data is latched by the strobe signal thus delayed, at a timing of transition defined by either one of a positive edge and a negative edge of each bit data included in the bit stream data, and the probability of occurrence of one of 1 and 0 falls within a predetermined range, the center of which is 50%.

2. The data receiving circuit according to claim 1, wherein the calibration pattern repeats 1 and 0 alternately, and wherein the frequency of the strobe signal is set to a value obtained by dividing the bit rate of the data by an even number.

3. The data receiving circuit according to claim 1, wherein the delay control unit includes a counter that counts up or down in accordance with the output latch data of the latch circuit, and acquires the probabilities of occurrence of 1 and 0 in accordance with a count value in the counter.

4. The data receiving circuit according to claim 3, wherein a pseudo random pulse stream is inputted to the counter as an operation clock, and the counter executes a count operation in accordance with the output latch data at the edge timing of the pseudo random pulse stream.

5. The data receiving circuit according to claim 1, wherein the delay control unit includes a capacitor and a charge/discharge circuit that charges or discharges the capacitor in accordance with the output latch data of the latch circuit, and acquires the probabilities of occurrence of 1 and 0 based on a voltage across the capacitor.

6. The data receiving circuit according to claim 1, wherein the variable delay circuit adds a delay, which is obtained by combining a delay amount obtained by the delay control unit and an offset delay amount set in accordance with a unit interval of the data, to the strobe signal, when receiving data.

7. A test apparatus that tests a plurality of data items outputted from a DUT, the test apparatus comprising a plurality of data receiving circuits according to claim 1, which are provided for each of the plurality of data items, wherein the plurality of data receiving circuits independently adjust the delay amount to be added to the strobe signal.

8. A timing adjustment method for a strobe signal that latches data subjected to bit stream transmission, the timing adjustment method comprising:
    providing an adjustable delay to the strobe signal;
    latching each bit data included in the bit stream data by the delayed strobe signal at a timing of transition defined by either one of a positive edge and a negative edge of each bit data;
    acquiring the latched data statistically while a calibration operation is being executed in which a known calibration pattern is inputted as the data; and
    adjusting the delay amount provided to the strobe signal such that the probability of occurrence of one of 1 and 0 falls within a predetermined range, the center of which is 50%.

* * * * *